(12) United States Patent
Shirai

(10) Patent No.: US 10,892,220 B2
(45) Date of Patent: Jan. 12, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Toshiaki Shirai, Chiba (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/559,274

(22) Filed: Sep. 3, 2019

(65) Prior Publication Data

US 2020/0303298 A1    Sep. 24, 2020

(30) Foreign Application Priority Data

Mar. 20, 2019   (JP) ................. 2019-052925

(51) Int. Cl.
| | | |
|---|---|---|
| *H01L 23/522* | (2006.01) | |
| *H01L 23/528* | (2006.01) | |
| *H01L 23/50* | (2006.01) | |

(52) U.S. Cl.
CPC .......... *H01L 23/5226* (2013.01); *H01L 23/50* (2013.01); *H01L 23/5286* (2013.01); *H01L 23/528* (2013.01)

(58) Field of Classification Search
CPC ............. H01L 23/5226; H01L 23/5286; H01L 27/0688; H01L 21/768; H01L 21/823475; H01L 23/50; H01L 23/528; H01L 23/5283

USPC ................. 257/774, 773, 390; 438/629, 637, 438/639.455

See application file for complete search history.

(56) References Cited

U.S. PATENT DOCUMENTS

| | | | |
|---|---|---|---|
| 2008/0239780 A1 | 10/2008 | Sasaki et al. | |
| 2010/0252934 A1* | 1/2010 | Law et al. | ........ H01L 21/76811 |
| | | | 257/774 |
| 2014/0252650 A1 | 9/2014 | Utsumi | |
| 2018/0144755 A1 | 5/2018 | Lee et al. | |

FOREIGN PATENT DOCUMENTS

| | | |
|---|---|---|
| JP | 2008-251835 A | 10/2008 |
| JP | 2010-245414 A | 10/2010 |
| JP | 2014-175493 A | 9/2014 |
| JP | 2018-067693 A | 4/2018 |
| JP | 2018-85452 A | 5/2018 |

* cited by examiner

*Primary Examiner* — Thinh T Nguyen
(74) *Attorney, Agent, or Firm* — White & Case LLP

(57) ABSTRACT

In general, according to one embodiment, a semiconductor device includes a power switch, a lowermost interconnect layer in which a power supply interconnect, a ground interconnect and a virtual power supply interconnect are formed, each having an access point to the power switch, an intermediate interconnect layer above the lowermost interconnect layer, an uppermost interconnect layer in which a power supply interconnect, a ground interconnect and a virtual power supply interconnect are formed, an interconnect layer located above the intermediate interconnect layer, and located immediately under the uppermost interconnect layer, and a power supply via, a ground via and a virtual power supply via.

6 Claims, 3 Drawing Sheets

SEMICONDUCTOR DEVICE

CROSS-REFERENCE TO RELATED APPLICATIONS

This application is based upon and claims the benefit of priority from Japanese Patent Application No. 2019-052925, filed Mar. 20, 2019, the entire contents of which are incorporated herein by reference.

FIELD

Embodiments described herein relate generally to a semiconductor device.

BACKGROUND

There have been proposed technologies relating to a semiconductor integrated circuit in which an improvement in routing congestion of signal interconnects is a task to be addressed.

In a semiconductor integrated circuit in which a plurality of interconnects are stacked, a core region is divided into functional block regions, and power supply shutdown control is executed by power switches which are provided in a lowermost interconnect layer with respect to each of the divided functional block regions.

In this kind of semiconductor integrated circuit, power supply stacked-via portions are placed in a spread fashion in order to connect upper-side power supply interconnect layers and the power switches. Thus, in intermediate interconnect layers in which various kinds of circuits are formed, signal interconnects cannot be passed in linear shapes by avoiding such power supply stacked-via portions, this resulting in a factor that considerably lowers the degree of freedom in designing circuitry.

DETAILED DESCRIPTION

Hereinafter, embodiments will be described with reference to the accompanying drawings.

In general, according to one embodiment, there is provided a semiconductor device in which a plurality of interconnect layers are stacked. The semiconductor device includes: a power switch implemented by a primitive unit lattice under the interconnect layers, the power switch being configured to shut down power supply in a divided functional block region; a lowermost interconnect layer in which a power supply interconnect, a ground interconnect and a virtual power supply interconnect are formed, each of the power supply interconnect, the ground interconnect and the virtual power supply interconnect having an access point to the power switch; an intermediate interconnect layer located in a layer above the lowermost interconnect layer; an uppermost interconnect layer in which a power supply interconnect, a ground interconnect and a virtual power supply interconnect are formed in an arrangement direction which is perpendicular to an arrangement direction of the power supply interconnect, the ground interconnect and the virtual power supply interconnect of the lowermost interconnect layer; an interconnect layer located in a layer above the intermediate interconnect layer, and located immediately under the uppermost interconnect layer; and a power supply via, a ground via and a virtual power supply via, which are stacked vias, and are juxtaposed in the arrangement direction of the power supply interconnect, the ground interconnect and the virtual power supply interconnect of the lowermost interconnect layer, and which penetrate from the interconnect layer immediately under the uppermost interconnect layer to the lowermost interconnect layer.

Figure 1:
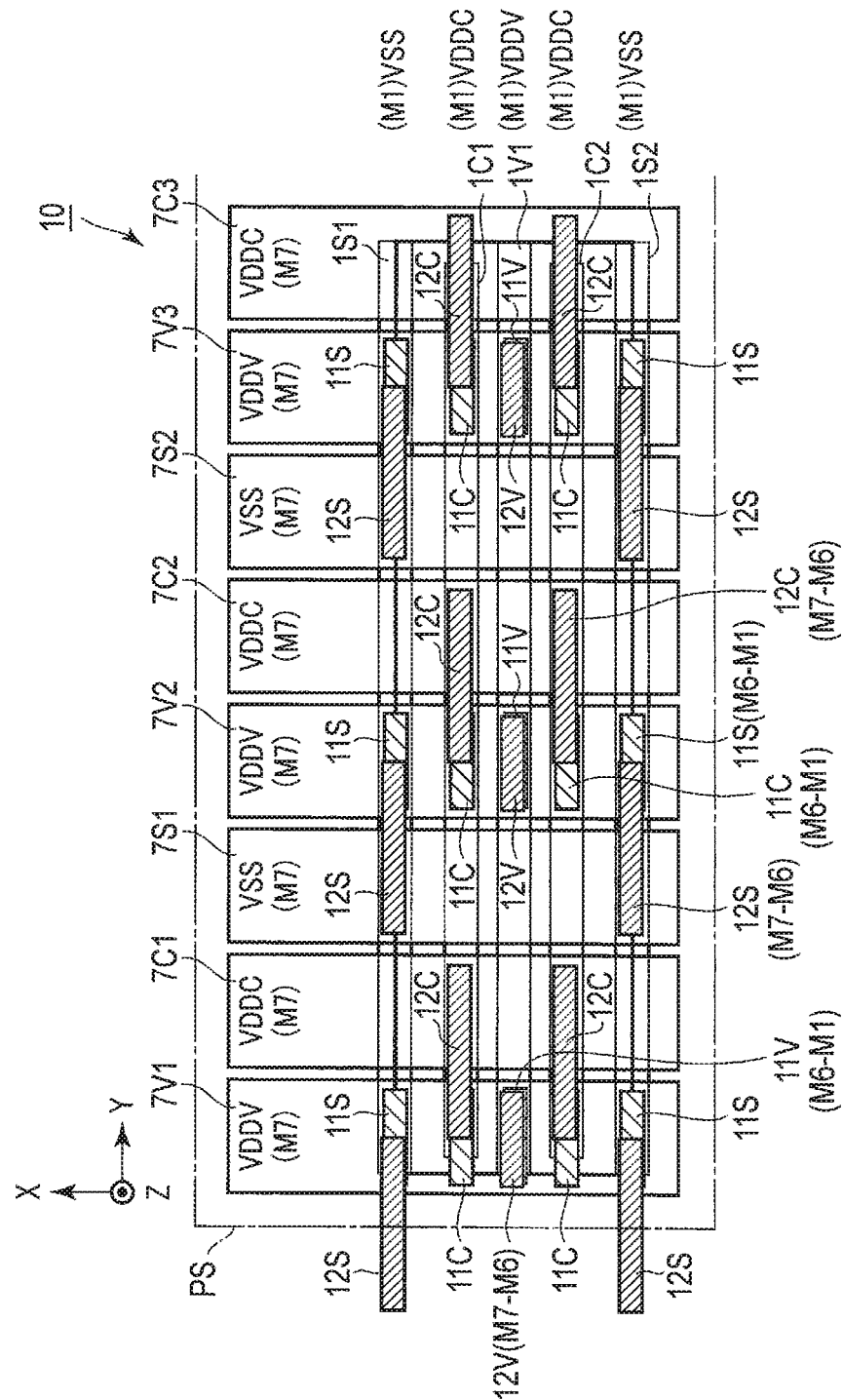
FIG. 1 a plan view illustrating a schematic configuration of a power supply interconnect component of a semiconductor integrated circuit according an embodiment.

FIG. 1 a plan view illustrating a schematic configuration of a power supply interconnect component of a semiconductor integrated circuit 10 according an embodiment. FIG. 1 exemplarily illustrates a configuration corresponding to one of power switches PS composed of CMOS transistors, which are implemented by primitive unit lattices in a silicon region under a lowermost interconnect layer of the semiconductor integrated circuit 10. When the semiconductor integrated circuit 10 is divided into a plurality of functional blocks, the power switch PS is provided to control the supply and shutdown of power supply with respect to each of the regions of the functional blocks. A plurality of power switches PS are placed, for example, in a manner to surround the region of the functional block along the frame of the functional block.

FIG. 1 illustrates a configuration of power supply interconnects of an uppermost interconnect layer M7 and a lowermost interconnect layer M1, by taking as an example the case in which the semiconductor integrated circuit includes seven interconnect layers in which an uppermost interconnect layer is M7 and a lowermost interconnect layer is M1.

The lowermost interconnect layer M1 includes, as a set, a ground interconnect (VSS) 1S1, a power supply interconnect (VDDC) 1C1, a virtual power supply interconnect (VDDV) 1V1, a power supply interconnect (VDDC) 1C2, and a ground interconnect (VSS) 1S2. These interconnects are provided with access points to power switches PS which are mounted on the lower side of these interconnects.

On the other hand, in the uppermost interconnect layer M7, in an arrangement direction perpendicular to the arrangement direction of the interconnects of the lowermost interconnect layer M1, virtual power supply interconnects, power supply interconnects and ground interconnects are repetitively formed to be a pattern in such an order as a virtual power supply interconnect (VDDV) 7V1, a power supply interconnect (VDDC) 7C1, a ground interconnect (VSS) 7S1, a virtual power supply interconnect (VDDV) 7V2, a power supply interconnect (VDDC) 7C2, a ground interconnect (VSS) 7S2, . . . .

In FIG. 1, for example, the arrangement direction of the ground interconnects 1S1 and 1S2, power supply interconnects 1C1 and 1C2 and virtual power supply interconnect 1V1 in the lowermost interconnect layer M1 is defined as a direction X. The arrangement direction of the ground interconnects 7S1, 7S2, . . . , power supply interconnects 7C1, 7C2, . . . , and virtual power supply interconnects 7V1, 7V2, . . . , in the uppermost interconnect layer M7 is defined as a direction Y that is perpendicular to the direction X. The direction of stacking of the seven layers, which is perpendicular to the drawing sheet (X-Y plane) of FIG. 1, is defined as a direction Z.

Furthermore, stacked vias, namely ground vias 11S, power supply vias 11C, virtual power supply vias 11V, power supply vias 11C, and ground vias 11S, which penetrate from the interconnects 1S1, 1C1, 1V1, 1C2 and 1S2 of the interconnect layer M6 to the interconnects 1S1, 1C1, 1V1, 1C2 and 1S2 of the lowermost interconnect layer M1, are juxtaposed along the virtual power supply interconnects 7V1, 7V2, . . . , of the uppermost interconnect layer M7. The cross-sectional shape of each of the ground vias 11S, power supply vias 11C and virtual power supply vias 11V, as viewed in the X direction, is a rectangular shape having long sides along the direction of extension of each interconnect of the lowermost interconnect layer M1.

In addition, ground vias 12S, which are stacked vias, are provided between two layers that are the interconnect layer M6 immediately under the uppermost interconnect layer M7, and the uppermost interconnect layer M7. The ground vias 12S are directly connected to the ground vias 11S in the interconnect layer M6, and electrically connect the ground vias 11S to the ground interconnects 7S1, 7S2, . . . , which neighbor (on the left side in FIG. 1) the virtual power supply interconnect 7V1, virtual power supply interconnect 7V2, . . . , of the uppermost interconnect layer M7.

Similarly, power supply vias 12C, which are stacked vias, are provided between two layers that are the interconnect layer M6 immediately under the uppermost interconnect layer M7, and the uppermost interconnect layer M7. The power supply vias 12C are directly connected to the power supply vias 11C in the interconnect layer M6, and electrically connect the power supply vias 11C to the power supply interconnects 7C1, 7C2, . . . , which neighbor (on the right side in FIG. 1) the virtual power supply interconnect 7V1, virtual power supply interconnect 7V2, . . . , of the uppermost interconnect layer M7.

The virtual power supply vias 11V are provided with virtual power supply vias 12V which extend the virtual power supply vias 11V directly from the interconnect layer M6 to the virtual power supply interconnects 7V1, 7V2, . . . , of the uppermost interconnect layer M7.

Each ground via 12S extends from the side of the ground interconnect 7S1, 7S2, . . . , toward the ground via 11S, and is put in contact with, and electrically connected to, about half the upper side of the ground via 11S in the interconnect layer M6. Further, in the uppermost interconnect layer M7, each ground via 12S is electrically connected to the ground interconnect 7S1, 7S2, . . . , which neighbors the virtual power supply interconnect 7V1, 7V2, . . . . Similarly, each power supply via 12C extends from the side of the power supply interconnect 7C1, 7C2, . . . , toward the power supply via 11C, and is put in contact with, and electrically connected to, about half the upper side of the power supply via 11C in the interconnect layer M6. Further, in the uppermost interconnect layer M7, each power supply via 12C is electrically connected to the power supply interconnect 7C1, 7C2, . . . , which neighbors the virtual power supply interconnect 7V1, 7V2, . . . . Thus, each of the ground vias 12S and power supply vias 12C has a length in the Y direction, which is about 1.5 times greater than the width of each interconnect of the uppermost interconnect layer M7.

As described above, each virtual power supply via 11V is preferentially extended to the uppermost interconnect layer M7 by each virtual power supply via 12V. Thereby, the influence of the voltage drop in the entirety of interconnects of the power supply network can be optimized.

Power supply interconnect layers are composed as global interconnect layers in the two layers of the uppermost interconnect layer M7 and the interconnect layer M6 immediately below the uppermost interconnect layer M7. On the other hand, intermediate interconnect layers are composed in the interconnect layers M2 to M5.

Figure 2:
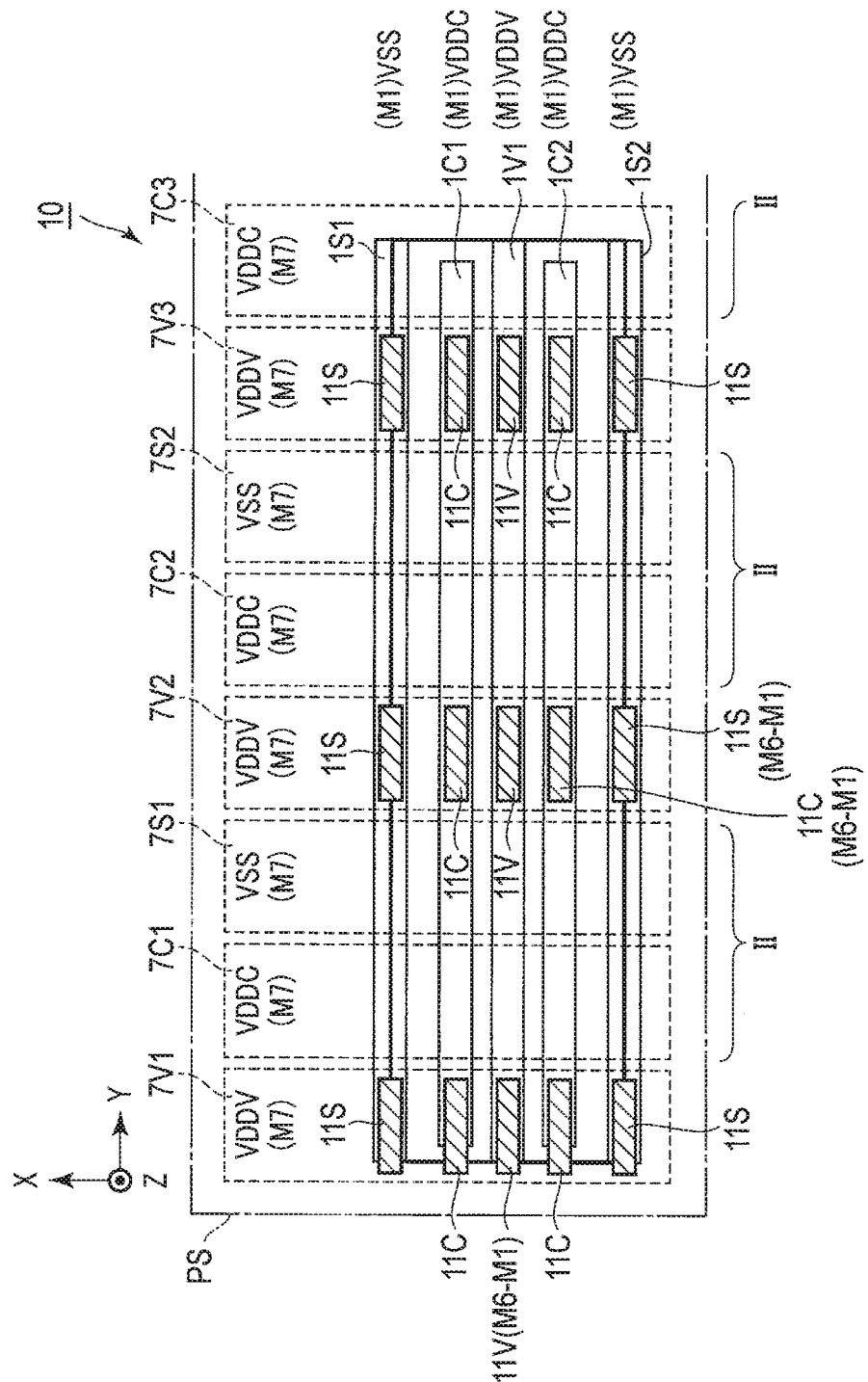
FIG. 2 is a view illustrating the configuration of FIG. 1 of the embodiment, with a configuration of interconnect layers M6 and M7 in FIG. 1 being omitted.

FIG. 2 is a view illustrating the configuration of FIG. 1, with the configuration of the global interconnect layers M6 and M7 in FIG. 1 being omitted. As illustrated in FIG. 2, in the intermediate interconnect layers that constitute the interconnect layers M2 to M5 on the upper side of the lowermost interconnect layer M1, the ground vias 11S, power supply vias 11C and virtual power supply vias 11V are juxtaposed along the virtual power supply interconnects 7V1, 7V2, . . . , of the uppermost interconnect layer M7. Thus, signal interconnects or the like can freely be assigned and passed in ranges indicated by II in FIG. 2, which correspond to the power supply interconnects 7C1, 7C2, . . . , and ground interconnects 7S1, 7S2, . . . , of the uppermost interconnect layer M7.

Figure 3A:
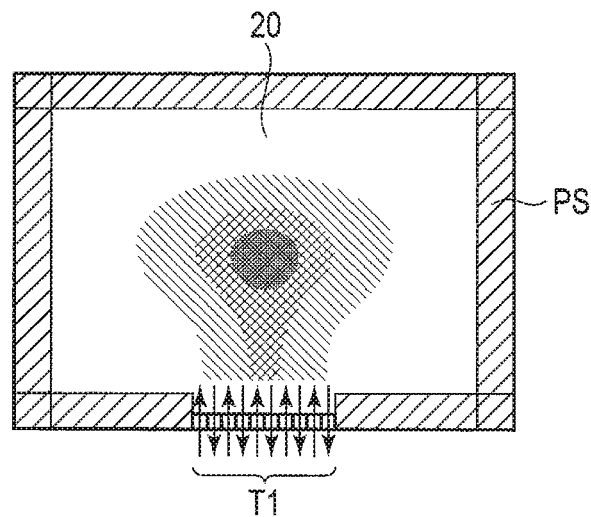
FIG. 3A and FIG. 3B illustrate a distribution tendency of a voltage drop in one functional block region of the semiconductor integrated circuit according to the embodiment, by comparison with a conventional configuration.
Figure 3B:
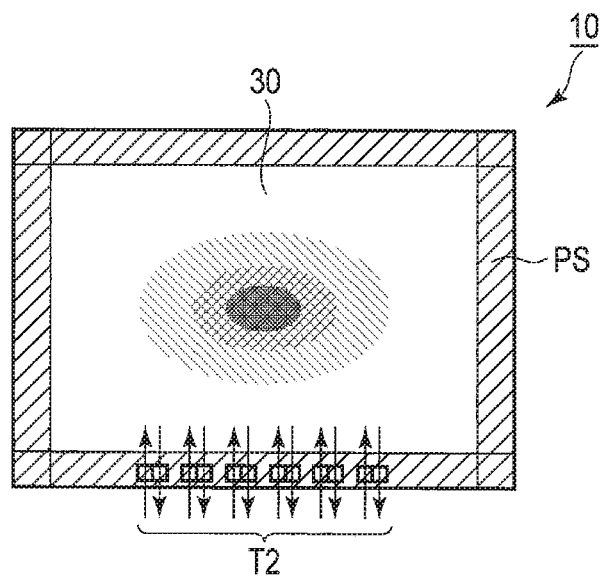

FIG. 3A and FIG. 3B illustrate a distribution tendency of a voltage drop in one functional block region of the semiconductor integrated circuit according to the embodiment, by comparison with a conventional configuration.

FIG. 3A illustrates, for the purpose of reference, a functional block region 20 in a conventional configuration, which does not include the configuration as illustrated in FIG. 1. A plurality of power switches PS are placed along an outer frame of the entirety of the functional block region 20. However, in a signal terminal portion T1 of this functional block region 20, since signal interconnects are passed, power switches PS cannot be placed under the signal interconnects.

Thus, there is no choice but to adopt such a configuration that a power switch is selected from among power switches located outside the signal terminal portion T1 and is connected as a power switch for shutting off the power supply of a circuitry portion near the signal terminal portion T1. Accordingly, as the degree of occurrence of a voltage drop is indicated by the density of hatching in the approximately central area in FIG. 3A, the influence by the voltage drop occurs as a result, even in the part that is normally located near the periphery of the functional block region 20 like the vicinity of the signal terminal portion T1.

FIG. 3B illustrates a functional block region 30 in the semiconductor integrated circuit 10 according to the present embodiment. A plurality of power switches PS are placed along an outer frame of the entirety of the functional block region 30, as well as in a signal terminal portion T2. As illustrated in FIG. 2, signal interconnects can be passed, even at positions where the power switches PS are placed.

Thus, as the degree of occurrence of a voltage drop is indicated by the density of hatching in the approximately central area in FIG. 3B, the influence by the voltage drop can surely be eliminated in the part near the periphery of the functional block region 30 like the vicinity of the signal terminal portion T2.

As has been described above, according to the embodiments, the arrangement in which signal interconnects are passed in the intermediate interconnect layers can be implemented even at locations where power switches are provided under the interconnect layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. A semiconductor device in which a plurality of interconnect layers are stacked, comprising:
    a power switch implemented by a primitive unit lattice under the interconnect layers, the power switch being configured to shut down power supply in a divided functional block region;
    a lowermost interconnect layer in which a power supply interconnect, a ground interconnect and a virtual power supply interconnect are formed, each of the power supply interconnect, the ground interconnect and the virtual power supply interconnect having an access point to the power switch;
    an intermediate interconnect layer located in a layer above the lowermost interconnect layer;
    an uppermost interconnect layer in which a power supply interconnect, a ground interconnect and a virtual power supply interconnect are formed in an arrangement direction which is perpendicular to an arrangement direction of the power supply interconnect, the ground interconnect and the virtual power supply interconnect of the lowermost interconnect layer;
    an interconnect layer located in a layer above the intermediate interconnect layer, and located immediately under the uppermost interconnect layer; and
    a power supply via, a ground via and a virtual power supply via, which are stacked vias, and are juxtaposed in the arrangement direction of the power supply interconnect, the ground interconnect and the virtual power supply interconnect of the lowermost interconnect layer, and which penetrate from the interconnect layer immediately under the uppermost interconnect layer to the lowermost interconnect layer.

2. The semiconductor device according to claim 1, wherein the power supply via, the ground via and the virtual power supply via are juxtaposed in a direction of extension of the virtual power supply interconnect in the uppermost interconnect layer.

3. The semiconductor device according to claim 1, wherein the power supply via and the ground via are electrically connected to the power supply interconnect and the ground interconnect, respectively, which neighbor the virtual power supply interconnect in the uppermost interconnect layer.

4. The semiconductor device according to claim 1, further comprising another power supply via and another ground via, which are provided between two layers that are the interconnect layer immediately under the uppermost interconnect layer, and the uppermost interconnect layer, and which are directly connected to the power supply via and the ground via in the interconnect layer immediately under the uppermost interconnect layer, and which electrically connect the power supply via and the ground via, respectively, to the power supply interconnect and the ground interconnect which neighbor the virtual power supply interconnect.

5. The semiconductor device according to claim 4, wherein the another power supply via extends toward the power supply via and is connected to a part of the power supply via in the interconnect layer immediately under the uppermost interconnect layer, and
    the another ground via extends toward the ground via and is connected to a part of the ground via in the interconnect layer immediately under the uppermost interconnect layer.

6. The semiconductor device according to claim 1, wherein the virtual power supply via is provided with another virtual power supply via which extends the virtual power supply via from the interconnect layer immediately under the uppermost interconnect layer to the virtual power supply interconnect in the uppermost interconnect layer.

* * * * *